(12) United States Patent
Wickramanayaka

(10) Patent No.: US 7,625,472 B2
(45) Date of Patent: Dec. 1, 2009

(54) PLASMA-ASSISTED SPUTTER DEPOSITION SYSTEM

(75) Inventor: Sunil Wickramanayaka, Tama (JP)

(73) Assignee: Canon Anelva Corporation, Kanagawa (JP)

( * ) Notice: Subject to any disclaimer, the term of this patent is extended or adjusted under 35 U.S.C. 154(b) by 807 days.

(21) Appl. No.: 10/905,574

(22) Filed: Jan. 11, 2005

(65) Prior Publication Data

US 2005/0150457 A1 Jul. 14, 2005

(30) Foreign Application Priority Data

Jan. 13, 2004 (JP) ............... 2004-005866
Mar. 30, 2004 (JP) ............... 2004-099398

(51) Int. Cl.
*C23C 14/00* (2006.01)

(52) U.S. Cl. ............... 204/298.27; 204/298.2; 204/298.18; 204/298.28

(58) Field of Classification Search ............ 204/298.27, 204/298.18
See application file for complete search history.

(56) References Cited

U.S. PATENT DOCUMENTS

| | | | | |
|---|---|---|---|---|
| 4,282,083 | A | * | 8/1981 | Kertesz et al. ......... 204/298.17 |
| 5,126,029 | A | | 6/1992 | Tomer et al. |
| 5,378,341 | A | | 1/1995 | Drehman et al. |
| 5,944,968 | A | | 8/1999 | Kobayashi et al. |
| 6,238,528 | B1 | * | 5/2001 | Xu et al. ................ 204/192.12 |
| 6,287,435 | B1 | | 9/2001 | Drewery et al. |
| 6,432,286 | B1 | | 8/2002 | Glocker |
| 6,458,252 | B1 | * | 10/2002 | Russell ................ 204/192.12 |
| 6,613,199 | B1 | | 9/2003 | Tobin et al. |
| 6,841,050 | B2 | * | 1/2005 | Hong et al. ............... 204/298.2 |
| 2002/0064595 | A1 | | 5/2002 | Nomura et al. |
| 2003/0079984 | A1 | * | 5/2003 | Okatani et al. ......... 204/192.12 |

FOREIGN PATENT DOCUMENTS

| | | |
|---|---|---|
| EP | 0 853 330 A2 | 7/1999 |
| JP | 05-189762 | 7/1993 |
| JP | 07-126847 | 5/1995 |
| JP | 10-212573 | 8/1998 |
| JP | 2002-167661 | 6/2002 |
| JP | 2002-296413 | 10/2002 |
| WO | WO 01/53562 A1 | 7/2001 |
| WO | WO 03/100819 | 12/2003 |

OTHER PUBLICATIONS

British Search Report Application No. GB 0500118.5, dated Apr. 12, 2005.
English language translation of a Japanese Office Action received on Aug. 21, 2009 in corresponding Japanese Patent Application No. 2004-099398.

* cited by examiner

*Primary Examiner*—Nam X Nguyen
*Assistant Examiner*—John Brayton
(74) *Attorney, Agent, or Firm*—Buchanan Ingersoll & Rooney PC

(57) ABSTRACT

A plasma-assisted sputter deposition system includes a reactor 1 into which a process gas is introduced; a doughnut-shaped electrode to be sputtered by plasma, in which a lower surface thereof is angled to a surface of a wafer; a spinning plate that spin on its central axis while moving over a circle above the doughnut-shaped electrode, in which the spinning plate contains magnet arrangement; an electrical power sources connected to the doughnut-shaped electrode, and a wafer holder for placing a wafer for film deposition, which is at rest during the film deposition.

13 Claims, 5 Drawing Sheets

PRIOR ART

PLASMA-ASSISTED SPUTTER DEPOSITION SYSTEM

BACKGROUND OF THE INVENTION

1. Field of the Invention

The present invention relates to a plasma-assisted sputter deposition system, and more particularly, to a plasma-assisted sputter deposition system for depositing thin films on a wafer, in which a wafer holder is at rest during the film deposition, with a great uniformity and a great accuracy of film thickness controllability.

2. Description of the Related Art

Magnetron DC or RF sputtering systems are in wide application to deposit thin films on substrates used in semiconductor industry. One of the major requirements in depositing films on substrates, for examples, on Si wafers, is the film uniformity. In order to deposit films with a greater uniformity, a DC sputtering system with an angled electrode with respect to wafer surface has been invented and in use (JP-A-2002-167661 and JP-A-2002-296413). However, this system has some problems in controlling the substrate temperature, re-sputtering of deposited film and particle reduction. These problems are explained in detail with reference to FIG. 5.

FIG. 5 shows a cross sectional view of a DC sputtering system with an angled electrode. The reactor 100 is comprised of an electrode 101, a wafer holder 102, gas inlets 103 and a gas outlet 104. The electrode 101 is made of a metal, for example, Al, Ti, Ta etc. that needs to be sputtered and deposited on a wafer 112. The electrode 101 is electrically isolated from the reactor 100 using a dielectric material 105. Generally, on the upper surface of electrode 101 a plurality of magnets 106 with some specific arrangement has been placed. Further, magnets 106 arranged to the electrode 101 are rotated around an off-axis or the central axis of the electrode 101. A round arrow 121 shows the state of rotation movement around the central axis. The electrode 101 is connected to a DC power source 107.

Usually, the wafer holder 102 is comprised of a metal electrode 108, dielectric material 109, side-walls 110 and a shaft 111. The shaft 111 is connected to an electrical motor in order to rotate the wafer holder 102 on its central axis as shown by a round arrow 122. The electric motor is not shown in the figure.

DC plasma is generated within the reactor 100 by applying a DC current to the electrode 101 while maintaining a low pressure inside the reactor 100. Owing to the higher negative voltage of the electrode 101, ions in the plasma are accelerated to the electrode 101 and sputtered. These sputtered atoms then travel through the plasma and deposit on the wafer 112 and other surfaces, which are exposed to plasma.

The sputtered-atom flux coming from the angled electrode 101 is not uniform on the wafer surface. In order to get a uniform film on the wafer surface, the wafer holder 102 is rotated around its central axis. This results in a uniform film. All the problems in the above-explained PVD system come due to the wafer holder 102 being rotated.

The first problem is that wafer temperature during the film deposition cannot be controlled. This is because incorporation of a liquid-base cooling mechanism for the metal electrode 108 is difficult. Incorporation of a heating mechanism for the metal electrode 108 is also difficult. These difficulties are mechanical difficulties and arise due to the rotation of wafer holder 102. Deposition of films at a controlled temperature is of importance in obtaining films with desired physical and electrical properties. For example, deposition of Cu films as a seed layer for electroplating process has to be carried out at a temperature below zero for better surface smoothness.

The second problem is that fabrication of electrostatic chuck (ESC) on the metal electrode 108 to clamp the wafer by using electrostatic force is difficult due to the complexity in designing electrical connections. Wafer clamping by using the ESC is important when control on wafer temperature is needed during the film deposition process.

The third problem is that the supply of a rf current to the metal electrode 108 is also not easy due to the difficulty in making electrical connection to the rotating wafer holder 102. Application of the rf power to the metal electrode 108 is needed if the deposition has to be carried out with the bombardment of soft-ions or if the deposited film is needed to be re-sputtered.

The forth problem is the generation of particles within the reactor due to continuity of rotation of the wafer holder 102. The rotation of the wafer holder 102 causes vibration of its outer parts and peripheral parts. This eases delaminating of deposited film from the vibrating surfaces, which finally causes particle contamination on the wafer surface.

In addition, as the related arts concerning cathode or target of doughnut-shaped, documents such as JP-A-7-126847 and JP-A-5-189762 may be cited.

OBJECTS AND SUMMARY

At present, it is desired to solve the above-mentioned four problems. In the magnetron DC or RF sputtering systems proposed by the present invention, the wafer holder is at rest when processing the wafers, by changing or improving the structure of the electrode and related sections.

An object of the present invention is to provide a plasma-assisted sputter deposition system capable of solving the above-mentioned problems and maintaining good and required qualities such as film uniformity and thickness controllability by employing a doughnut-shape electrode with an angled surface, a magnet configuration with rotation and revolution (planetary motion), and a temperature-controllable wafer holder which is at rest during the film deposition.

A plasma-assisted sputter deposition system in accordance with an embodiment of the present invention is configured as follows in order to attain the above-mentioned object.

A plasma-assisted sputter deposition system is comprised of a reactor into which a process gas is introduced to be used for producing plasma; a doughnut-shaped electrode made of a material for sputtering by the plasma, wherein a lower surface of the doughnut-shaped electrode is angled or parallel to a surface of a wafer; a spinning plate that spins on its central axis while moving over a circle above the doughnut-shaped electrode, wherein the spinning plate contains magnet arrangement attached to its lower surface and is parallel to the surface of the doughnut-shaped electrode; an electrical power sources connected to the doughnut-shaped electrode, and a wafer holder for placing the wafer for film deposition, which is at rest during the film deposition.

In the above plasma-assisted sputter deposition system, preferably, the magnet arrangement on the lower surface of the spinning plate is symmetric around its spinning axis.

In the plasma-assisted sputter deposition system, preferably, the magnet arrangement on the lower surface of spinning plate is asymmetric around its spinning axis.

A plasma-assisted sputter deposition system is comprised of a reactor into which a process gas is introduced to be used for producing plasma; a doughnut-shaped electrode made of a material for sputtering by the plasma, wherein a lower surface of the doughnut-shaped electrode is angled or parallel to a surface of a wafer; two or more circular magnets with different diameters and placed above the doughnut-shaped electrode to have alternate polarities facing the electrode to generate one or more close-loop magnetic flux lines below the doughnut-shaped electrode; an electrical power sources connected to the doughnut-shaped electrode, and a wafer holder for placing the wafer for film deposition, which is at rest during the film deposition.

The plasma-assisted sputter deposition system in accordance with an embodiment of the present invention can maintain good and required qualities such as film uniformity and thickness controllability by employing a doughnut-shape electrode with an angled surface, a magnet configuration with a rotation and revolution, and a temperature-controllable wafer holder being at rest during the film deposition.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Hereinafter, preferred embodiments will be explained according to the attached drawings. Through the explanation of the embodiments, the details of the present invention will be clarified.

Figure 1:
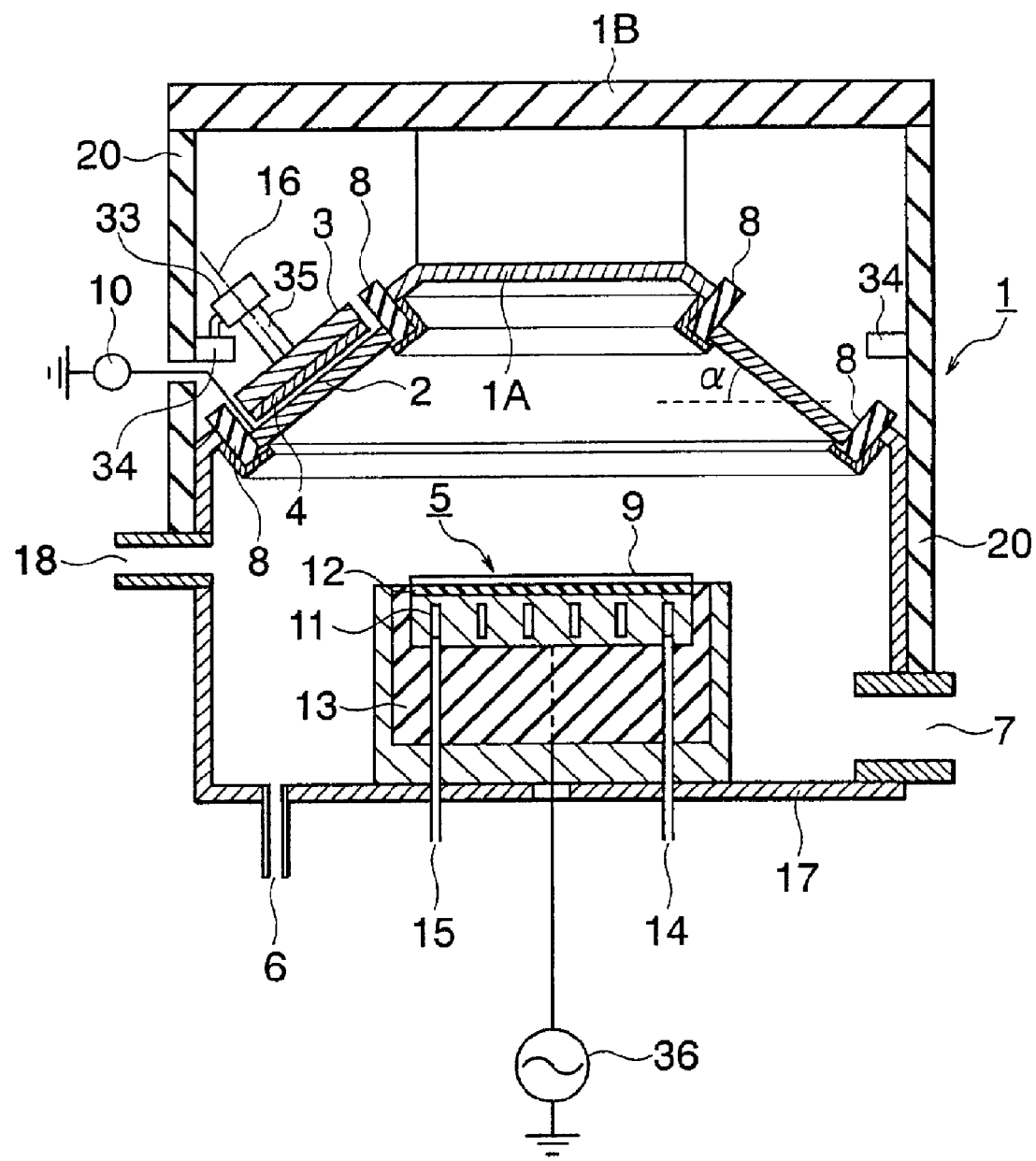
FIG. 1 is a longitudinal cross sectional diagram of the system of a first embodiment of the present invention.
Figure 2:
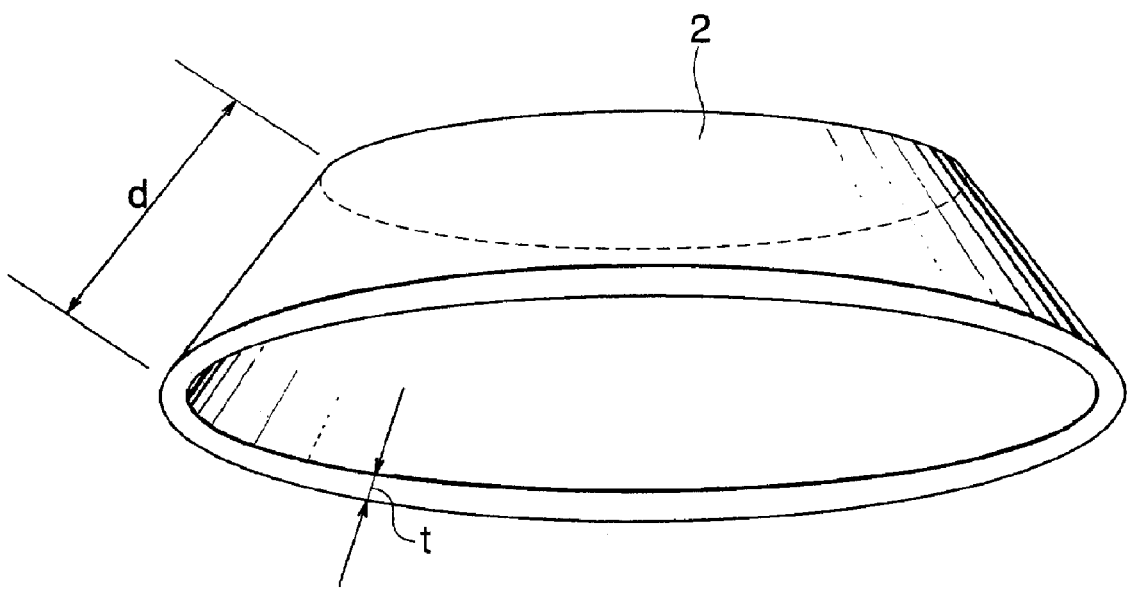
FIG. 2 is a perspective view of a doughnut-shaped electrode.
Figure 3:
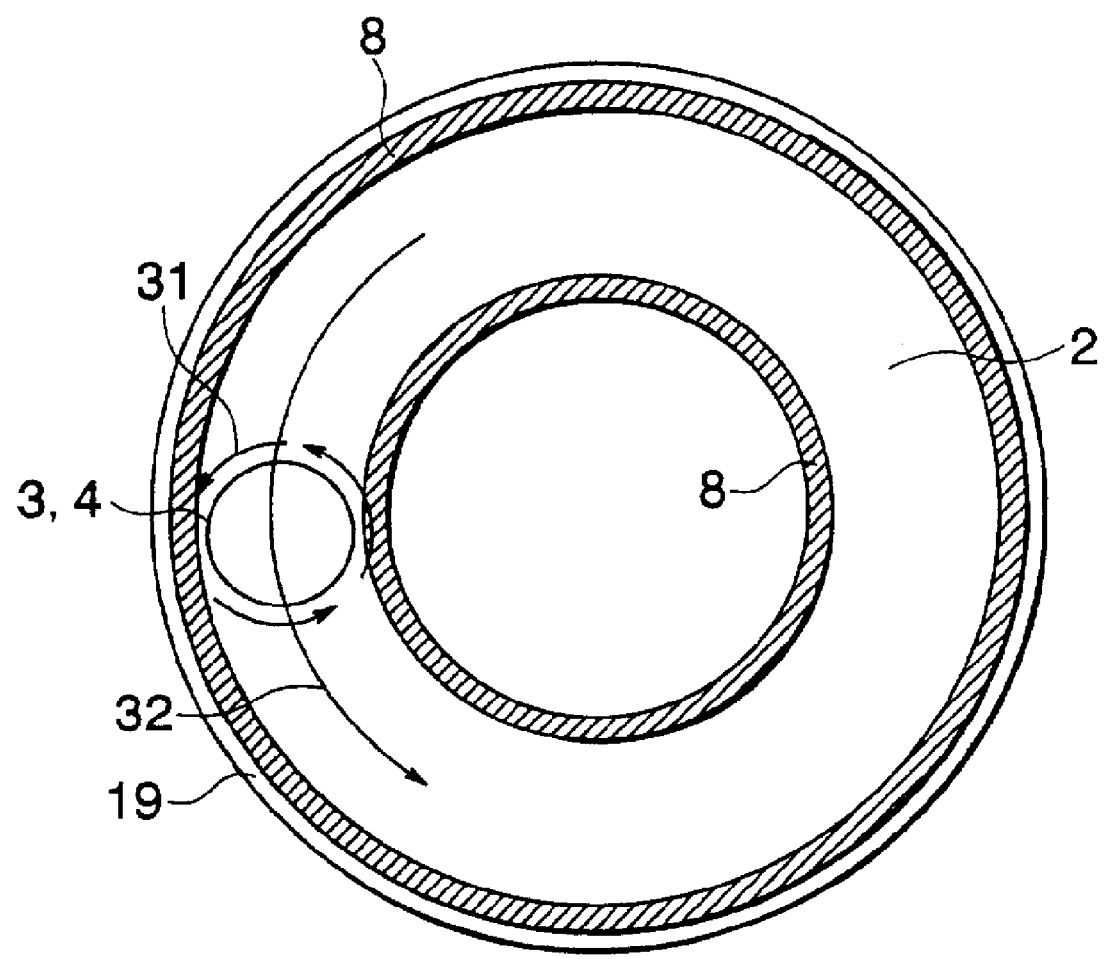
FIG. 3 is a schematic plan view of the doughnut-shaped electrode together with the movements of the spinning plate to the doughnut-shaped electrode.

In accordance with FIGS. 1-3 the first embodiment of the present invention is explained. FIG. 1 shows a longitudinal cross sectional diagram of the first embodiment of the plasma-assisted sputter deposition system of the present invention. The reactor 1 is provided with an electrode 2 arranged on its ceiling wall 1A and a wafer holder 5 arranged on its bottom plate 17. An upper-side support wall 1B supports the ceiling wall 1A. The ceiling wall 1A has a ring-shaped angled peripheral section. The electrode 2 is placed in the ring-shaped angled peripheral section of the ceiling wall 1A.

The electrode 2 is made of a metal such as Al, Ti, Ta etc. that is sputtered and deposited on a wafer 9 placed on the wafer holder 5. The electrode 2 is electrically isolated from the reactor 1 using a dielectric material 8. The electrode 2 is connected to a DC electric power source 10.

In the reactor 1 of the first embodiment, the electrode 2 is of a doughnut-shape or circular ring-shape, and there are gas inlets 6 at the bottom plate 17 and a gas outlet 7 at the lower section of the side wall 20 near the bottom plate 17. In the space at back of the electrode 2 there is a spinning plate or disk 3 to which a magnet arrangement 4 is attached.

The electrode 2 is made of a material that is sputtered and deposited on the wafer 9. The shape of the electrode 2 is circular with a hole in the center as shown in FIG. 2. The inner and outer diameters of the electrode 2 are not critical and decided by considering the wafer diameter and height from the wafer to the electrode 2. The centers of inner and outer diameters of the electrode 2 and the center of wafer 9 lie on the same straight line. The surfaces of electrode 2 are angled such that extension of these surfaces makes a conical-shape structure. The angle between the electrode surface and a horizontal line, which is denoted by "α" in FIG. 1 is not critical and generally smaller than 45°. One can also use a case that α is equal to 0, that is, that the electrode surface is parallel to the wafer surface. The thickness of the electrode 2 denoted by "t" in FIG. 2 is also not critical and can lie in the range of 2 mm to 20 mm. A thinner electrode 2 is preferable as it yields a higher magnetic flux on its lower surface. The electrode 2 is covered by an insulating material 8 in order to electrically isolate from the rest of the parts of the reactor 1 and is given a DC or rf electrical power. As one example, a DC power source 10 is shown in FIG. 1.

The magnet arrangement 4 comprised of a plurality of magnets is fixed to the spinning plate 3. The spinning plate 3 is usually made of a metal. The diameter of the spinning plate 3 is usually taken slightly shorter than the width of the electrode 2 denoted by "d" in FIG. 2. However, one can employ the spinning plate larger than the electrode width "d" with suitable hardware modifications.

The spinning plate 3 constantly spins on its central axis 16. In addition, the spinning plate 3 with the magnet arrangement 4 moves on a circular path above the electrode 2 similar to planetary motion. In this case, the spinning plate 3 is parallel to the surface of the doughnut-shaped electrode 2. These motions are schematically shown in FIG. 3. In FIG. 3, an arrow mark 31 denotes the spin motion and an arrow mark 32 denotes the planetary motion. A mechanism for making the spin motion and the planetary motion is comprised of a motor 33 connected to the central axis 16, a ring-shape guide member with a gear mechanism fixed to the side-wall 20 of the upper-side support wall 1B, and an connecting member for connecting the motor 33 and the ring-shaped guide member 34. When the motor 33 operates, the central axis 35 is rotated and the unit including the motor 33 and the spinning plate 3 is moved along the ring-shaped guide member 34 through the gear mechanism.

The magnet arrangement 4 below the spinning plate 3 is not critical and may be any symmetric or asymmetric magnet arrangement.

The wafer holder 5 is fixed to the bottom plate 17. It is comprised of a metal electrode 11, an electric static chuck (ESC) 12 or a thin dielectric layer 12, and an insulator 13. The metal electrode 11 is supplied with a temperature-controlled liquid via a liquid inlet 14 and an outlet 15. The temperature-controlled liquid is used to maintain a constant temperate usually in the range of 100° C. to −100° C. on the metal electrode 11. If a higher temperature, generally over 100° C. is needed, one can fix an electrical heating system within the metal electrode 11. There is the thin dielectric layer 12 on the upper surface of metal electrode to form the ESC. Within this dielectric layer 12 there may be very thin metal electrode or electrodes as a part of the ESC. Again, there may be a gas feeding mechanism to the ESC in order to increase the thermal conductivity between the wafer 9 and the ESC. Detailed explanation of the configuration of the ESC is not given as it commonly available in literature. The wafer holder 5 is fixed on the bottom plate 17 of the reactor 1. This eases making electrical wiring and cooling/heating mechanisms. However, one can make the wafer holder 5 movable in the vertical direction with the all facilities mentioned-above. The important feature of the wafer holder 5, compared to that explained in prior art, is that the wafer and the wafer holder are at rest during the film deposition. That is there are no any rotating parts of the wafer holder 5.

The operation of the above-mentioned structure is explained. The wafer 9 which is introduced into the reactor 1 through a wafer in/out door 18 is placed on the fixed wafer holder 5. The wafer 9 in the wafer holder 5 is electrostatically clamped on the ESC. The ESC is maintained to be a constant temperature with the assist of coolant or a heater. A gas is fed into the reactor 1 and the reactor is maintained a desired pressure. The pressure inside the reactor 1 is not critical and can be vary in the range of 0.1 mTorr to 100 mTorr. A DC electrical power is applied to the electrode 2 from the DC power source 10 to initiate and maintain plasma. The electric power of the DC current applied to the electrode 2 is not important and is decided by the required deposition rate and other parameters. If a lower deposition rate is required, a lower power, for example 100 W, is applied. Specially, when a precise control of the film thickness is needed, the deposition has to be done at a lower rate, for example 10 nm/min. In this case a lower DC power, for example 50 W, is applied to the electrode 2. Even though the whole electrode 2 is subjected to the same negative voltage applied by the DC power source 10, the plasma is concentrated below the spinning plate 3 since plasma is confined by the magnetic field. This dense plasma moves on a circular path below the electrode 2 with the movement of the spinning plate 3 with magnet arrangement 4. The sputtering is mainly occurred at the place where the dense plasma is and the sputtered atoms reach the wafer surface with angles. Therefore, the film deposition process is almost similar to that explain in the prior art section resulting in a film with a very good film uniformity.

The metal electrode 11 in the wafer holder 5 may or may not be given an rf current. Even if a rf power is applied the power of the rf current from a rf power source 36 is usually kept a lower value so that there is no excessive sputtering of the deposited film.

The sputtering system of the first embodiment yields extremely uniform films with the controllability of film thickness with a great accuracy while the wafer temperature can be maintained at any desired value. Further, deposition can be performed with the soft-ion bombardment or with re-sputtering processes.

In accordance with the first embodiment, the wafer holder 5 is at rest and the plasma produced at a region under the electrode 2, which corresponds to the magnet arrangement 4 of the spin plate 3, is rotated together with the planetary movement (revolution) of the spin plate 3. Therefore, even if the wafer holder 5 is not rotated, the uniform thin film is deposited onto the wafer 9 on the wafer holder 5.

Figure 4:
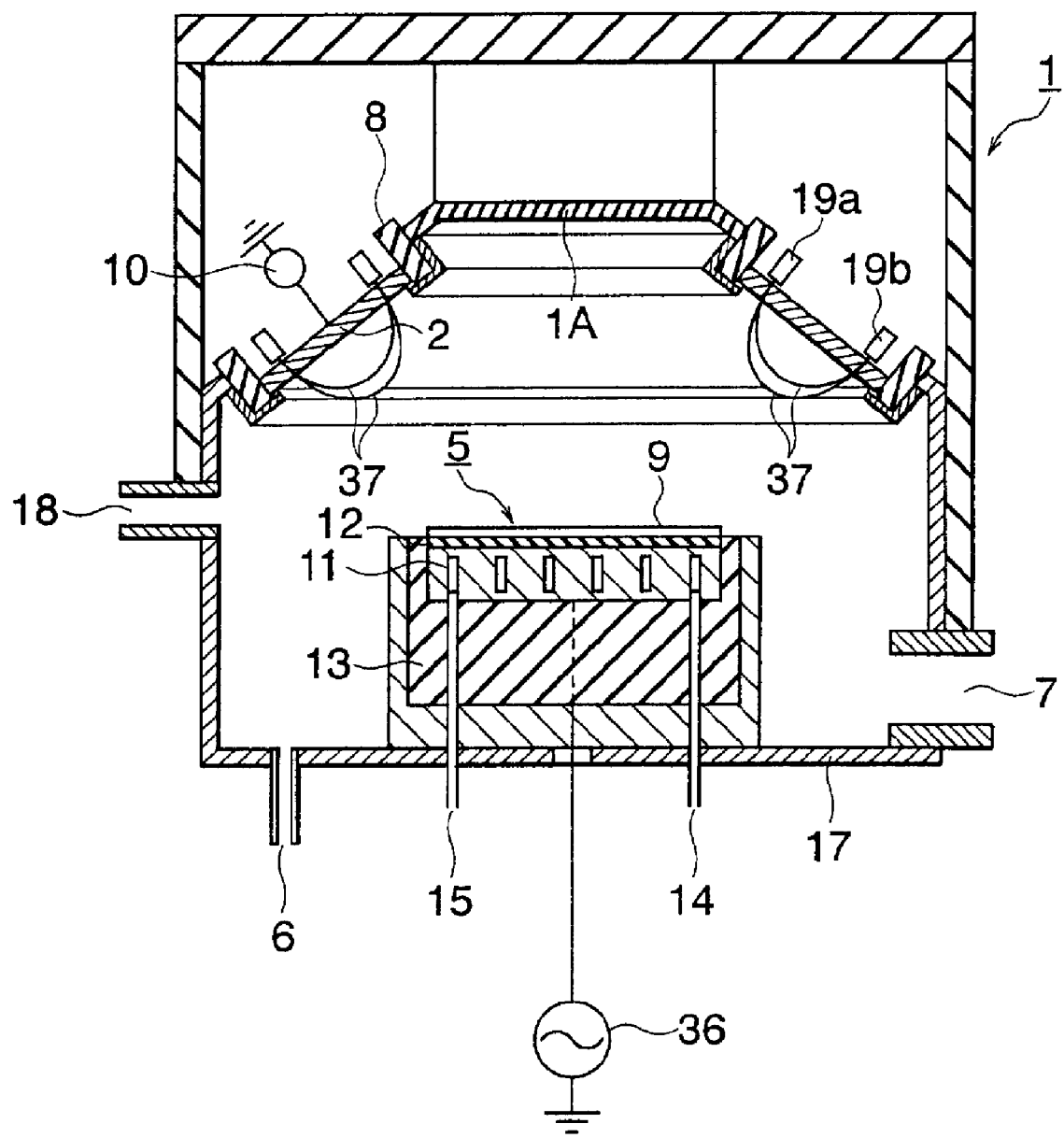
FIG. 4 is a longitudinal cross sectional diagram of the system of a second embodiment of the present invention.
Figure 5:
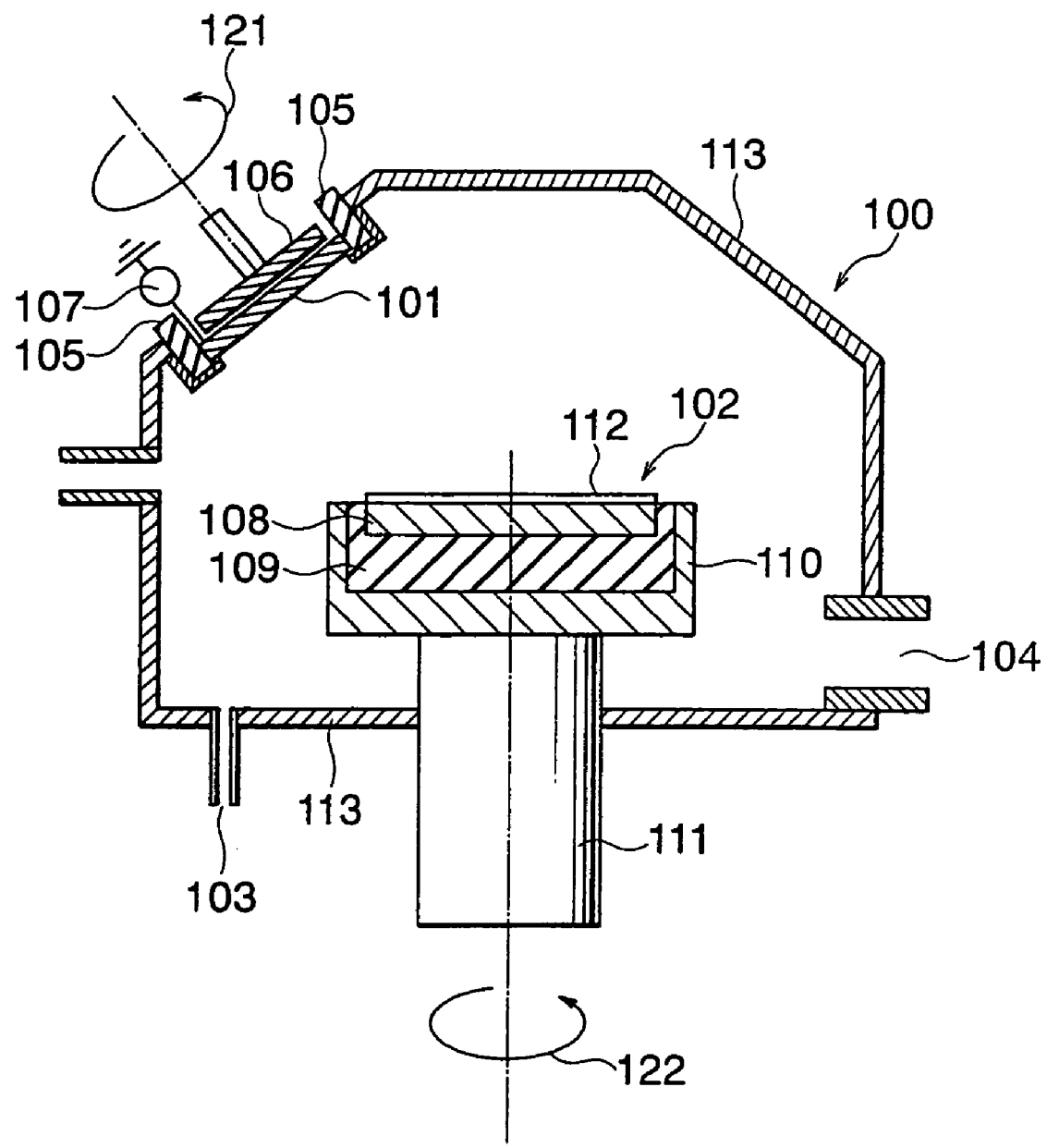
FIG. 5 is a longitudinal cross sectional diagram of the conventional system.

Next, the second embodiment is explained with reference to FIG. 4. It is a slight modification of the first embodiment. The only modification in this system, compared to the first embodiment, is to use new structure of magnet arrangement corresponding to the magnet arrangement 4 without the above spinning plate 3. Here, two or more circular magnets 19a and 19b are placed on the outside surface of the electrode 2, which have alternate polarities facing the electrode surface. They are not moved. A configuration with the two circular magnets 19a and 19b is shown in FIG. 4, for example. These two magnets 19a and 19b are permanently fixed on the electrode or placed with a small separation, for example 1 mm, with the electrode and slightly moved parallel to electrode surface. There are magnetic flux lines 37 between the two circular magnets 19a and 19b. The magnetic flux lines 37 penetrate the electrode 2 into the inside of reactor 1. The slight movement of the circular magnets 19a and 19b results in an improvement of electrode utilization efficiency.

The application of the DC power or rf power source to the electrode 2 is same as that explained in the first embodiment. However, with the magnet arrangement strong doughnut-shape plasma is generated below the electrode 2 and the sputtering happens over a doughnut shape surface at the same time. Therefore, with this configuration, the deposition rate gets increased.

Except the above-mentioned changes, all the other structure, functions, procedures and results are the same as that explained in the first embodiment.

The present invention is used for plasma-assisted magnetron sputtering without rotating the wafer holder, and useful for depositing films on the wafer with film uniformity and thickness controllability, and a temperature-controllable in the wafer holder.

The configurations, shapes, sizes, and relative arrangements explained in the above embodiments are only generally shown to an extent enabling the present invention to be understood and worked. Further, the numerical values and compositions (materials) of the configurations are only illustrations. Therefore, the present invention is not limited to the embodiments explained above and can be modified in various ways so long as not departing from the scope of the technical idea shown in the claims.

The present disclosure relates to subject matter contained in Japanese Patent Application No. 2004-5866 filed on Jan. 13, 2004, and Japanese Patent Application No. 2004-99398 filed on Mar. 30, 2004, the disclosures of which are expressly incorporated herein by references in its entirety.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A plasma-assisted sputter deposition system comprising:
   a reactor into which a process gas is introduced to be used for producing plasma,
   a doughnut-shaped electrode made of a material for sputtering by said plasma, wherein a lower surface of said doughnut-shaped electrode is angled to a surface of a wafer,
   a spinning plate that spins on its central axis while moving in a circular path with respect to the central axis of the doughnut-shaped electrode above the doughnut-shaped electrode, wherein said spinning plate contains a magnet arrangement attached to its lower surface and is parallel to the angled side surface of said doughnut-shaped electrode,
   a mechanism configured to have a motor connected to a central axis of said spinning plate, a ring-shaped guide member with gear mechanism fixed to a side wall of said reactor, and a connection member for connecting said motor and said ring-shaped guide member, for spinning said spinning plate on its central axis by the operation of said motor and moving said spinning plate above said doughnut-shaped electrode and along said ring-shaped guide member around the central axis of said doughnut-shaped electrode through said gear mechanism of said ring-shaped guide member by the operation of said motor,
   an electrical power source connected to said doughnut-shaped electrode, and a wafer holder for placing said wafer for film deposition, which is at rest during the film deposition.

2. The plasma-assisted sputter deposition system as claimed in claim 1, wherein said magnet arrangement on the lower surface of said spinning plate is symmetric around its spinning axis.

3. The plasma-assisted sputter deposition system as claimed in claim 1, wherein said magnet arrangement on the lower surface of spinning plate is asymmetric around its spinning axis.

4. A plasma-assisted sputter deposition system comprising:
   a reactor in which plasma is produced by a process gas,
   a circular target electrode made of a material sputtered by said plasma, having a hole at a center and a side surface angled to a surface of a wafer,
   a spinning plate having a magnet arrangement and being placed over the side surface of said circular target electrode,
   an electrical power source connected to said circular target electrode,
   a wafer holder for placing said wafer for film deposition, which is at rest during the film deposition, and
   a mechanism configured to have a motor connected to a central axis of said spinning plate, a ring-shaped guide member with gear mechanism fixed to a side wall of said reactor, and a connection member for connecting said motor and said ring-shaped guide member, for spinning said spinning plate on the central axis by the operation of said motor and moving said spinning plate above said circular target electrode and along said ring-shaped guide member around the central axis of said circular target electrode through said gear mechanism of said ring-shaped guide member by the operation of said motor.

5. The plasma-assisted sputter deposition system as claimed in claim 4, wherein said magnet arrangement on said spinning plate is symmetric around its spinning axis.

6. The plasma-assisted sputter deposition system as claimed in claim 4, wherein said magnet arrangement on said spinning plate is asymmetric around its spinning axis.

7. The plasma-assisted sputter deposition system as claimed in claim 4, wherein said magnet arrangement facing to said circular target electrode and having at least two circular magnets with different poles and different diameters which is placed over said circular target electrode, in order to generate one or more loop magnetic fluxes under said circular target electrode.

8. The plasma-assisted sputter deposition system as claimed in claim 1, wherein the thickness of said target electrode ranges from 2 mm to 20 mm.

9. The plasma-assisted sputter deposition system as claimed in claim 1, wherein said target electrode is electrically isolated from said reactor by dielectric materials.

10. The plasma-assisted sputter deposition system as claimed in claim 1, wherein a diameter of said spinning plate is smaller than the width of said target electrode.

11. The plasma-assisted sputter deposition system as claimed in claim 4 wherein the thickness of said target electrode ranges from 2 mm to 20 mm.

12. The plasma-assisted sputter deposition system as claimed in claim 4 wherein said target electrode is electrically isolated from said reactor by dielectric materials.

13. The plasma-assisted sputter deposition system as claimed in claim 4 wherein a diameter of said spinning plate is smaller than the width of said target electrode.

* * * * *

UNITED STATES PATENT AND TRADEMARK OFFICE
CERTIFICATE OF CORRECTION

PATENT NO. : 7,625,472 B2  Page 1 of 1
APPLICATION NO. : 10/905574
DATED : December 1, 2009
INVENTOR(S) : Sunil Wickramanayaka It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1115 days.

Signed and Sealed this

Twenty-first Day of December, 2010

David J. Kappos
*Director of the United States Patent and Trademark Office*